United States Patent [19]
Someya et al.

[11] Patent Number: 5,311,282
[45] Date of Patent: May 10, 1994

[54] HIGH PRECISION STEPPING ALIGNER HAVING A SPIRAL STEPPING PATTERN

[75] Inventors: Atsushi Someya; Tohru Ogawa, both of Kanagawa, Japan

[73] Assignee: Sony Corporation, Japan

[21] Appl. No.: 853,834

[22] Filed: Mar. 19, 1992

[30] Foreign Application Priority Data

Mar. 28, 1991 [JP] Japan .................... 3-089582

[51] Int. Cl.$^5$ .............................. G01B 9/02
[52] U.S. Cl. .................... 356/358; 356/363; 359/848
[58] Field of Search ............. 356/357, 358, 363, 399, 356/400, 401; 250/548, 557; 359/846, 848

[56] References Cited

U.S. PATENT DOCUMENTS 4,764,003  8/1988  Lake et al. ............... 359/846
4,780,615 10/1988  Suzuki ..................... 356/400

FOREIGN PATENT DOCUMENTS 62-102523  5/1987  Japan .

Primary Examiner—Samuel A. Turner
Assistant Examiner—Robert Kim
Attorney, Agent, or Firm—Ronald P. Kananen

[57] ABSTRACT

A high precision stepping aligner includes a stage for carrying thereon an object and drivable to move the object stepwise relative to an exposing position so as to align a plurality of portions of the object in succession with the exposing position, where each of the portions is exposed to exposure light. The stage is moved stepwise first in the X-direction and then in the Y-direction. Thereafter, the stepping movement in the X-direction and the stepping movement in the Y-direction are repeated one after another so that the stage traces a substantially spiral stepping pattern. A mirror for reflecting a beam of light for positioning the stage is disposed on the stage with a heat insulating material interposed therebetween.

6 Claims, 5 Drawing Sheets

HIGH PRECISION STEPPING ALIGNER HAVING A SPIRAL STEPPING PATTERN

BACKGROUND OF THE INVENTION

1. Field of the Invention

The present invention relates generally to stepping aligners, and more particularly to a stepping aligner of the type having a stage movable to displace an object stepwise relative to an exposing position for exposing a plurality of portions of the object in succession to exposure light. The stepping aligner of this invention can be used in various fields of art for exposing various objects, for example, in a pattern lithography performed in the manufacture of electronic components such as semiconductor devices.

2. Description of the Prior Art

Conventionally, an object to be exposed is moved relative to an exposing position so that a plurality of portions of the object are exposed successively. For example, in the case of semiconductor devices, a plurality of portions of an object (wafer) to be exposed are arranged in rows in the X-direction and columns in the Y-direction. For exposing the object, one of these portions is aligned with an exposing position and then exposed to a shot of exposure light. Subsequently, the object is moved relative to the exposing position until the next portion is aligned with the exposing position. The next portion thus aligned is subsequently exposed to the exposure light. The foregoing cycle is repeated to expose the portions of the object in succession. In the specification and claims, such a relative movement between the object and the exposing position, which is performed stepwise, is referred to as a "stepping movement." A typical example of the prior art is disclosed in Japanese Patent Laid-open Publication No. 62-102523. When the exposure process is performed using a mask larger in size than a pattern to be formed, reduction projection alignment is needed. Such a reduction projection alignment is performed by a reduction projection aligner which is generally called as a "stepper." The term "stepping aligner" as used herein is, however, intended to include all the stepping aligners, such as reduction projection aligners, 1:1 projection aligners, etc., regardless of the magnification of a projection optics system used.

FIG. 5 shows the general construction of the reduction projection aligner. In this figure, numeral 6 is exposure light, 10 is an object to be exposed to the exposure light, 31 is an X-stage, 32 is a Y-stage, 41 is a ball screw for moving the X-stage 32 in the X-direction indicated by the arrow 51, and 42 is a ball screw for moving the Y-stage in the Y-direction indicated by the arrow 52.

There has been an increasing tendency to promote microminiaturization and integration of patterns to be formed on an object using the stepping aligner. In the manufacture of semiconductor integrated circuits, the minimum workable dimension of circuit patterns has been reduced to half-micron or even to the level of 0.35 $\mu$m. For a semiconductor device (64MDRAM, for example) having a pattern size of less than half-micron, the pattern exposure process must be performed with a very high alignment accuracy. In practice, the necessary overlay accuracy is on the order of 0.1 $\mu$m.

In the exposure technology requiring a very high precision alignment, the alignment accuracy can be deteriorated even by a trifling matter. For instance, in a KrF excimer laser stepper which is one of the effective apparatus for the high precision micromachining, the alignment accuracy in each of the X-direction and the Y-direction is not constant but varies with the individual objects (wafers) to be exposed. In addition, the dispersion of alignment accuracy in the X-direction has a different tendency from the dispersion of the alignment accuracy in the Y-direction.

FIGS. 8(A) and 8(B) are graphs showing the relationship between the alignment accuracy and the number of objects (wafers) to be exposed. FIG. 8(A) illustrates the data taken with respect to the X-direction, while FIG. 8(B) shows the data taken with respect to the Y-direction. As is apparent from the comparison between FIGS. 8(A) and 8(B), the alignment accuracy in the X-direction has a greater dispersion than the alignment accuracy in the Y-direction. In addition, FIG. 8(A) indicates that the alignment accuracy in the X-direction increases with an increase in number of the objects (wafers) and hence has a regular tendency. On the other hand, the alignment accuracy in the Y-direction varies at random regardless of the number of objects (wafers) as shown in FIG. 8(B) and, hence, has no regular tendency.

In the conventional stepping aligner, the stepping movement in the X and Y directions is generally performed in the pattern B shown in FIG. 3. More specifically, the object to be exposed is moved stepwise in the X-direction to expose a row of portions of the object in succession. Then, the object is moved in the Y-direction by a distance equal to the width of the row of portions of the object, and a next row of portions of the object are exposed successively in timed relation to the stepwise movement of the object in the X-direction. This stepping pattern B is adopted in order to improve the throughput of the exposure process. The data of the alignment accuracy shown in FIGS. 8(A) and 8(B) are taken when the exposure process is performed using the stepping pattern B shown in FIG. 3. In general, stepping of an object 10 to be exposed is carried out by using a stage 3 driven by means of an X axis ball screw 41 and a Y axis ball screw 42, as shown in FIG. 4. When the stepping is performed using the conventional stepping pattern B shown in FIG. 3, the amount of stepping movement (stepping length) in the X-direction is greater than that of the Y-direction.

It seems provably that the difference in dispersion distribution tendency between the alignment accuracy in the X-direction and the alignment accuracy in the Y-direction is caused by the stepping movement made in the pattern B shown in FIG. 3. Since the amount of stepping movement in the X-direction is greater than the amount of stepping movement in the Y-direction, the dispersion of the alignment accuracy becomes greater in the X-direction than in the Y-direction. In addition, during the stepping movement, movable components generate heat due to mechanical factors such as friction acting between the movable components. The heat thus generated seems to have direct effects upon the dispersion of alignment accuracy. Consequently, the stepping movement in the X-direction, which is greater in amount than that of the Y-direction, generates a greater amount of heat than the stepping movement in the Y-direction. In addition to the heat generated during the stepping movement of the stage in the X and Y directions, heat is also generated during shot (exposure of a portion of the object with exposure light) in the exposure process. In the stepping aligners, such as excimer laser steppers of the type wherein the TTL (through the lens) alignment system cannot be used, an alignment base line may be displaced due to the heat generated during the exposure process.

In order to perform a high precision alignment to obtain the above-mentioned minimum workable dimension of circuit patterns, the aligner must has a high precision X-Y-θ-Z stage. Conventionally, the X-Y-θ-Z stage is positioned by using interferometers. However, since the interferometers are susceptible to heat, the alignment accuracy tends to decrease when the interferometers are subjected to heat. FIG. 6 illustrates a manner in which the X-Y-θ-Z stage is positioned by a pair of interferometers 81, 82. A laser beam emitted from each of the interferometers 81, 82 returns to the interferometer 81, 82 after it is reflected by a corresponding one of two bar mirrors 1a, 1b disposed on the stage. In this instance, the positioning accuracy is determined by the fluctuation of temperature of air surrounding the path of the laser beam, and the flatness of the bar mirrors 1a, 1b. On the other hand, when the exposure process performed in the stepping aligner for forming patterns on a single object (wafer), the stage is moved a plurality of times equal to the number of shots. While the stage is moving, heat is generated from movable parts. A study made by the present inventor indicated that the heat generated during the movement of the stage raises the temperature by about 1° C. at maximum. When the heat is transmitted to the bar mirrors 1a, 1b, the bar mirrors 1a, 1b are thermally deformed with the result that the stage is misaligned within a range of about 0.1 μm. This misalignment results in a misalignment between a portion of the object (wafer) to be exposed and the exposing position where exposure light is projected. Thus, the alignment accuracy is lowered by heat.

As shown in FIG. 6, the stage is composed of an X-stage 31, a Y-stage 32, and a θ-Z stage 33. The X-stage 31 is movable in the direction of the arrow 51 in the same figure, while the Y-stage 32 is movable in the direction of the arrow 52. The X-stage 31 is driven by a motor 71 via a ball screw 41. The Y-stage 32 is driven by a motor 72 via a ball screw 42.

SUMMARY OF THE INVENTION

With the foregoing drawbacks of the prior art in view, an object of the present invention is to provide a stepping aligner which is capable of performing a precision alignment between a plurality of portions of an object to be exposed with an exposing position where each portion of the object is exposed to exposure light.

A stepping aligner of the type concerned has a stage for carrying thereon an object and moving the object stepwise relative to an exposing position so as to align a plurality of portions of the object in succession with the exposing position where each of the portions is exposed to exposure light. The stepping aligner according to a first aspect of this invention is characterized in that the stage is first moved stepwise in the X-direction to expose a group of the portions of the object, then moved stepwise in the Y-direction to expose another group of the portions of the object, and thereafter repeats the stepping movement in the X-direction and the stepping movement in the Y-direction one after another so that the stage traces a substantially spiral stepping pattern.

With the substantially spiral stepping pattern, the stepping length of the stage in the X-direction is substantially the same as the stepping length of the stage in the Y-direction. The temperature distribution of the stage can be kept always constant. Since the stage is free from temperature gradient, the alignment accuracy is not affected by heat generated during the stepping movement of the stage.

According to a second aspect of this invention, the stepping aligner includes a mirror for reflecting a light beam for positioning the stage. The mirror is disposed on the stage with a heat insulating member interposed therebetween.

Since the heat insulating member prevents transmission of heat from the stage to the mirror, the mirror is free from thermal deformation and hence able to position the stage accurately.

Many other advantages, features and additional objects of the present invention will become manifest to those versed in the art upon making reference to the detailed description and the accompanying drawings in which preferred structural embodiments incorporating the principles of the present invention are shown by way of illustrative example.

DETAILED DESCRIPTION OF THE INVENTION

The invention will be described below in greater detail with reference to certain preferred embodiments shown in the accompanying drawings.

Figure 1:
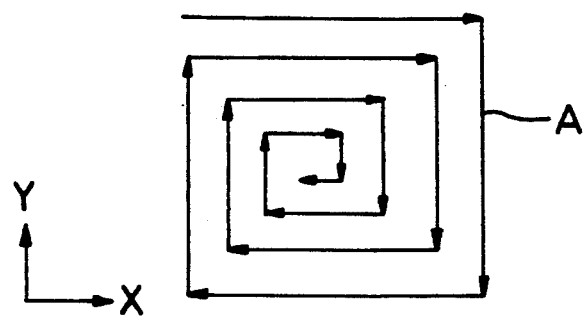
FIG. 1 is a diagrammatical view showing a pattern of stepping movement of a stepping aligner according to the present invention.
Figure 3:
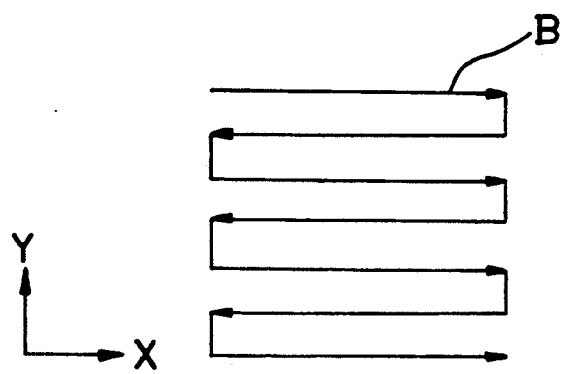
FIG. 3 is a diagrammatical view showing a pattern of stepping movement of a conventional stepping aligner.
Figure 4:
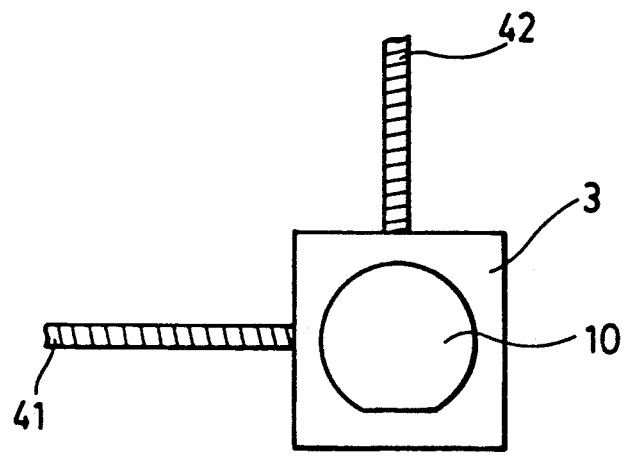
FIG. 4 is a diagrammatical plan view showing the general construction of a stepping aligner in which the present invention can be embodied.
Figure 5:
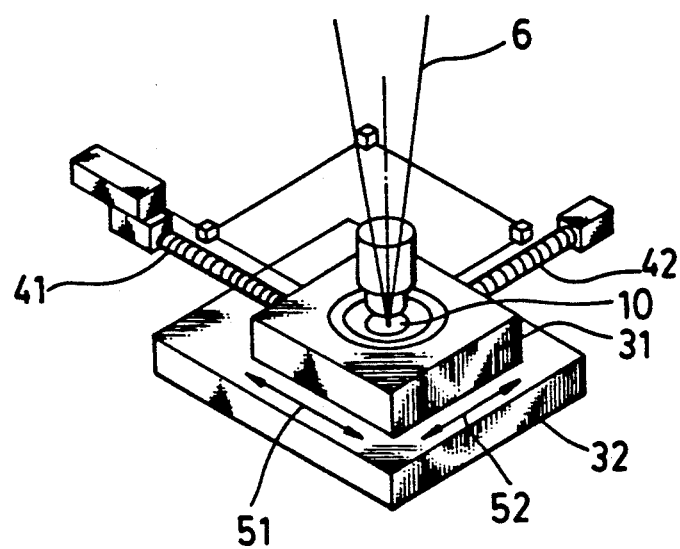
FIG. 5 is a schematic perspective view of a reduction projection aligner.
Figure 6:
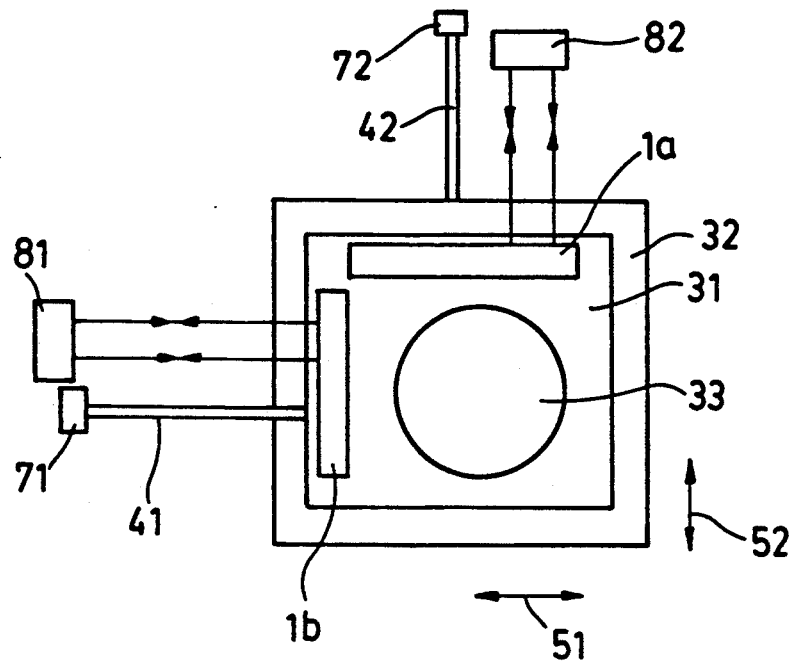
FIG. 6 is a diagrammatical plan view illustrative of a manner in which an X-Y-θ-Z stage is aligned.
Figure 7:
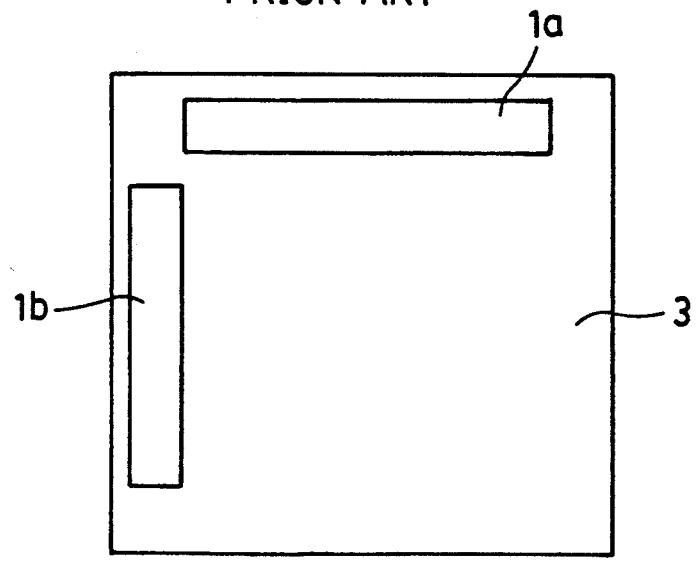
FIG. 7 is a diagrammatical plan view showing the arrangement of bar mirrors of the conventional stepping aligner.
Figure 8A:
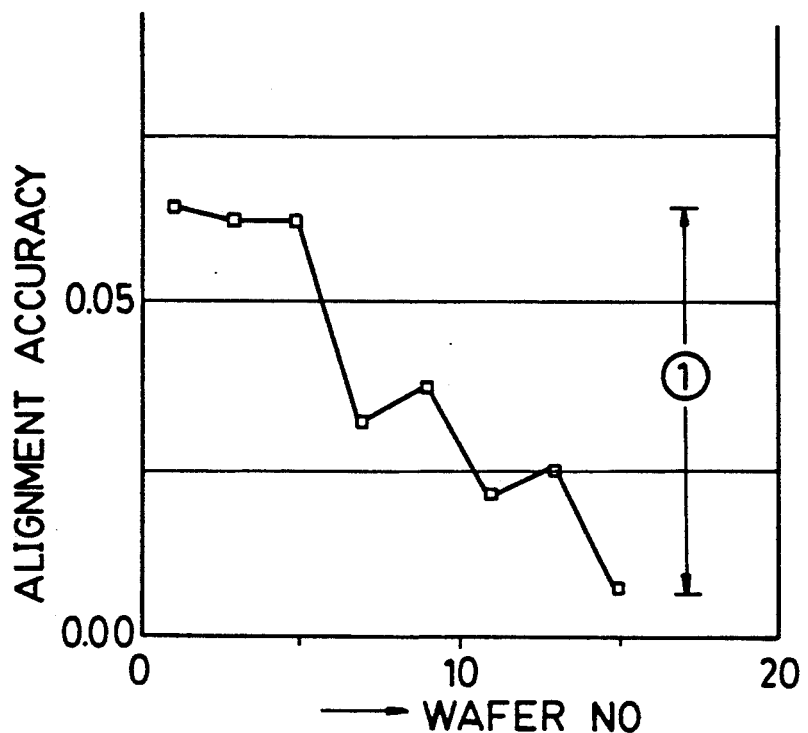
FIG. 8(A) is a diagram showing the relationship between the alignment accuracy in the X-direction and the number of wafers to be exposed.
Figure 8B:
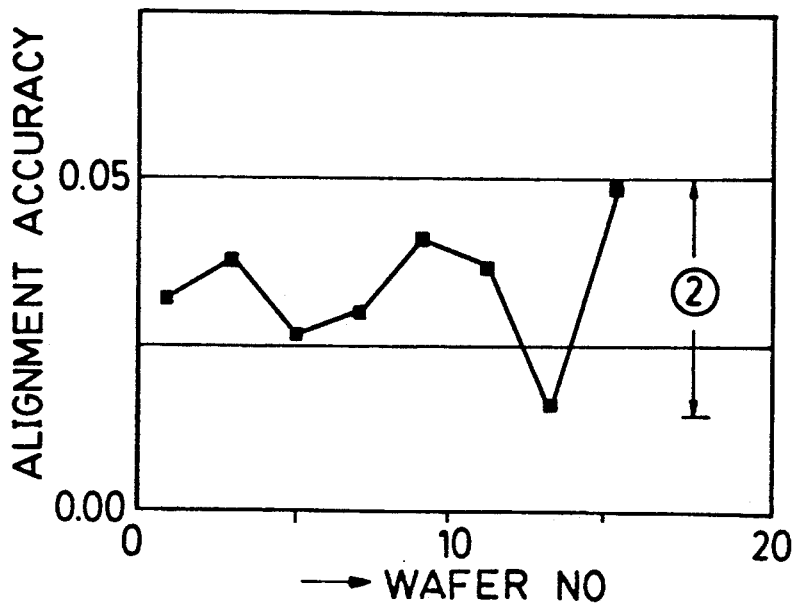
FIG. 8(B) is a diagram showing the relationship between the alignment accuracy in the Y-direction and the number of wafers to be exposed.

FIG. 1 shows a stepping pattern A of a stage of a stepping aligner according to an embodiment of this invention. In this embodiment, the stepping aligner is used for fabricating mincromachined and highly integrated semiconductor devices. As shown in FIG. 1, a stage on which an object (wafer) to be exposed is disposed is first moved stepwise in the X-direction to expose a row of portions of the object, and then moved stepwise in the Y-direction to expose a column of portions of the object. Thereafter, the foregoing stepping movement of the stage in the X-direction and the foregoing stepping movement of the stage in the Y-direction are repeated one after another so that the stage traces a substantially spiral stepping pattern A that occurs in a single plane and constantly decreases in size. This stepping pattern A is completely different from a zigzag or serpentine stepping pattern B shown in FIG. 3 which is performed by the conventional stepping aligner. The substantially spiral stepping pattern A shown in FIG. 1 is composed of an X-direction part and a Y-direction part perpendicular to one another. This stepping pattern A is adopted because the object to be exposed on the stepping aligner has a plurality of portions arranged in rows and columns. The stepping pattern A shown in FIG. 1 may be changed depending on the arrangement of portions of an object to be exposed. However, on of two succeeding parts of the stepping pattern A extends generally in the X-direction, while the other of the two succeeding parts of the spiral stepping pattern A extends generally in the Y-direction. In addition, the stepping pattern A extends in a direction circling around a central point. The spiral stepping pattern A may be a spiral curve occurring in one plane and constantly increasing (or decreasing) in size.

With this spiral stepping pattern A, the amount of movement (stepping length) of the stage in the X-direction is substantially the same as the amount of movement (stepping length) of the stage in the Y-direction. Consequently, a ball screw drivable to move the stage in the X-direction and a ball screw drivable to move the stage in the Y-direction equally generate equal amounts of heat during the movement of the stage. Thus, there is no temperature gradient created within a chamber. Furthermore, the temperature distribution during the stepping movement in the X-direction is the same as the temperature distribution during the stepping movement in the Y-direction. Thus, the positioning accuracy of the stage is not affected by heat, and each portion of the object can, therefore, be aligned with the exposing position with a very high accuracy. In addition, owing to the substantially spiral stepping pattern A, mechanical loads exerted on the movable parts are substantially constant throughout the stepping movement in either direction. Such a load distribution also contributes to increase the alignment accuracy of the stepping aligner. As against the stepping aligner having the substantially spiral stepping pattern A, the conventional stepping aligner having the serpentine stepping pattern B (FIG. 3) is unable to provide a high precision alignment because a stepping length in the X-direction is much longer than the stepping length in the Y-direction and, hence, creates an uneven load distribution and a temperature gradient which will lower the alignment accuracy of the stepping aligner.

Figure 2:
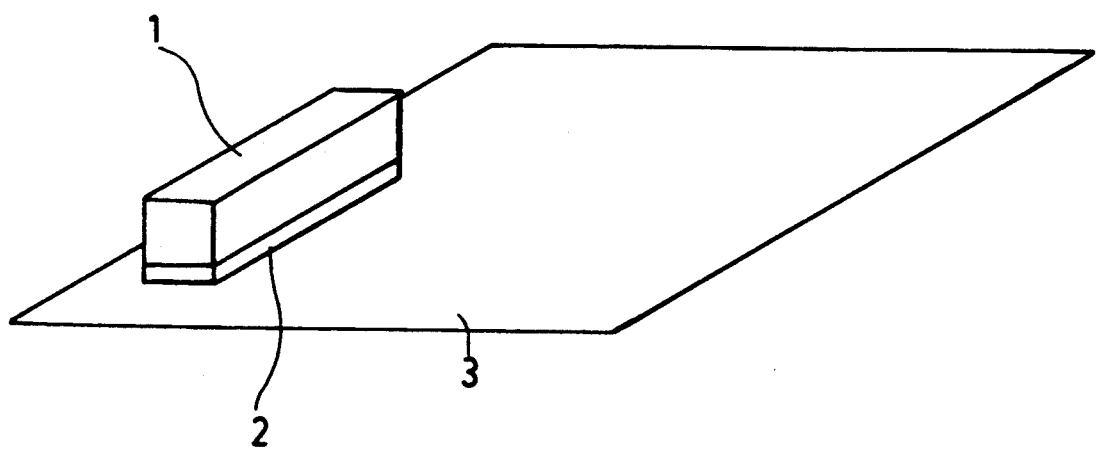
FIG. 2 is a schematic perspective view showing a portion of the stepping aligner.

FIG. 2 shows a second embodiment of this invention,

What is claimed is:

1. A stepping aligner having a stage for carrying thereon an object and for moving the object stepwise relative to an exposing position so as to align a plurality of portions of the object in succession with the exposing position where each of the portions is exposed to exposure light, wherein said stage is first moved stepwise in an X-direction to expose a group of the portions of the object, then moved stepwise in a Y-direction to expose another group of the portions of the object, and thereafter repeats the stepping movement in the X-direction and the stepping movement in the Y-direction one after another so that said stage traces a substantially spiral stepping pattern.

2. A stepping aligner, comprising a stage for carrying thereon an object and for moving the object stepwise relative to an exposing position so as to align a plurality of portions of the object in succession with the exposing position where each of the portions is exposed to exposure light, said stepping aligner comprising a mirror for reflecting a light beam for positioning said stage, wherein said mirror is disposed on said stage with a heat insulating member interposed between said mirror and said stage.

3. A stepping aligner having a stage for carrying thereon an object and for moving the object stepwise relative to an exposing position so as to align a plurality of portions of the object in succession with the exposing position where each of the portions is exposed to exposure light, said stepping aligner comprising a mirror for reflecting a light beam for positioning said stage, wherein said stage is first moved stepwise in an X-direction to expose a group of the portions of the object, then moved stepwise in a Y-direction to expose another group of the portions of the object, and thereafter repeats the stepping movement in the X-direction and the stepping movement in the Y-direction one after another so that said stage traces a substantially spiral stepping pattern, and wherein said mirror is disposed on said stage with a heat insulating member interposed between said stage and said mirror.

4. A stepping aligner as set forth in claim 1, wherein said stage comprises a mirror for reflecting a light beam for positioning said stage and a heat insulating member located between said mirror and said stage.

5. A method for positioning a stepping aligner having a stage for carrying thereon an object so as to align a plurality of portions of the object in succession with an exposing portion where each of the portions is exposed to exposure light, comprising the steps of moving said stage stepwise in an X-direction to expose a group of the portions of the object, moving said stage stepwise in a Y-direction to expose another group of the portions of the object, and repeating the stepping movement in the X-direction and the stepping movement in the Y-direction one after another so that said stage traces a substantially spiral stepping pattern.

6. A stepping method as set forth in claim 5, further comprising the step of reflecting a light beam off of a mirror to position said stage and placing a heat insulating member between said mirror and said stage.

* * * * *